United States Patent
Kitamoto et al.

[11] Patent Number: 6,140,844
[45] Date of Patent: *Oct. 31, 2000

[54] AMPLIFIER

[75] Inventors: Ayako Kitamoto; Masato Matsumiya, both of Kawasaki, Japan

[73] Assignee: Fujitsu Limited, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/055,399

[22] Filed: Apr. 6, 1998

[30] Foreign Application Priority Data

May 26, 1997 [JP] Japan ................................. 9-134202

[51] Int. Cl.[7] ................................................. G11C 7/06
[52] U.S. Cl. .............................. 327/55; 327/53; 327/52
[58] Field of Search ................ 327/51–57, 560–563, 327/309, 313, 314, 321, 322, 327, 328

[56] References Cited

U.S. PATENT DOCUMENTS

| | | | |
|---|---|---|---|
| 5,132,576 | 7/1992 | Park | 327/51 |
| 5,144,171 | 9/1992 | Huard | 327/54 |
| 5,218,570 | 6/1993 | Pascucci et al. | 327/52 |
| 5,648,935 | 7/1997 | Koh et al. | 327/51 |
| 5,694,363 | 12/1997 | Calligaro et al. | 327/51 |
| 5,856,748 | 1/1999 | Seo et al. | 327/53 |

OTHER PUBLICATIONS

"FA 13.2: A 7ns 140mW 1Mb CMOS SRAM with Current Sense Amplifier", Sasaki et al, IEEE International Solid–State Circuits Conference, 1992, pp. 208 and 209.

"A Current Sense–Amplifier for Fast CMOS SRAMs", Seevinck, 1990 Symposium on VLSI Circuits, pp. 71 and 72.

Primary Examiner—Toan Tran
Attorney, Agent, or Firm—Arent Fox Kintner Plotkin & Kahn

[57] ABSTRACT

In a current sense amplifier for detecting and amplifying the difference between the currents flowing on a pair of signal lines, an active device is provided that works to limit the amplitude of an output node of the current sense amplifier. Further, a differential amplifier for amplifying the amplitude-limited output of the current sense amplifier is provided on the output side of the current sense amplifier.

5 Claims, 7 Drawing Sheets

AMPLIFIER

BACKGROUND OF THE INVENTION

1. Field of the Invention

The present invention relates to an amplifier incorporated in a semiconductor integrated circuit for detecting and amplifying the difference between the currents flowing on a pair of signal lines, such as a data bus amplifier incorporated in a dynamic random-access memory (DRAM) or a sense amplifier incorporated in a static random-access memory (SRAM).

2. Description of the Related Art

The "circuit for detecting and amplifying the difference between the currents flowing on a pair of signal lines" to which the present invention is directed is described, for example, in "IEEE International Solid-State Circuits Conference, p. 208, 1992, by K. Sasaki et al." and "Symposium on VLSI Circuits, p. 71, 1990, by E. Seevinck."

In the circuit described in the former literature, since the current sense amplifier which detects and amplifies a differential current supplies its output directly as a signal to the circuit at the next stage, the potential of the output node of the current sense amplifier must be caused to swing fully to a level substantially equal to the supply voltage.

To reduce the time required for one data output and to thereby increase the operating speed, the load capacitance and resistance involved in data transmission must be reduced, but in practice it is difficult to reduce the load capacitance and resistance. Accordingly, if it is attempted to increase the operating speed, the potential of the output node cannot be made to swing fully within a predetermined time and only swings around a level about one half of the supply voltage.

Furthermore, when outputting data continuously, data output is susceptible to the effect of the immediately preceding data output because the potential of the output node begins to rise or fall when the output node is still at a certain potential level depending on the output of the preceding data. The amplitude of the output node potential thus becomes unstable, and if data transmission is continued in this situation, an erroneous operation may result.

On the other hand, the circuit described in the latter literature has the problem that the operating speed decreases when the supply voltage is as low as about 2 V.

When the supply voltage is 3 V or higher, this problem does not show, but when the supply voltage is 2 V or lower, the operating speed decreases due to the low supply voltage and, at the same time, the effect of threshold voltage variations of MOS transistors becomes pronounced, slowing the operation and resulting in reduced margin for supply voltage and threshold levels.

SUMMARY OF THE INVENTION

It is an object of the present invention to provide an amplifier which is capable of high-speed operation with a low voltage and with low current consumption, is less susceptible to the effect of threshold voltage variations, and is capable of responding with high sensitivity to an input of a small-amplitude signal.

According to the present invention, there is provided an amplifier comprising: a current sense amplifier for converting a difference between currents flowing on a pair of signal lines into a potential difference, detecting and amplifying the potential difference, and outputting the amplified results at a pair of output nodes; an amplitude-limiting circuit for limiting the amplitude of potentials of the pair of output nodes; and a differential amplifier for amplifying the difference between the amplitude-limited potentials of the pair of output nodes.

DESCRIPTION OF THE PREFERRED EMBODIMENTS

Before describing the preferred embodiments of the present invention, the previously mentioned prior art will be described with reference to a drawing.

Figure 1:
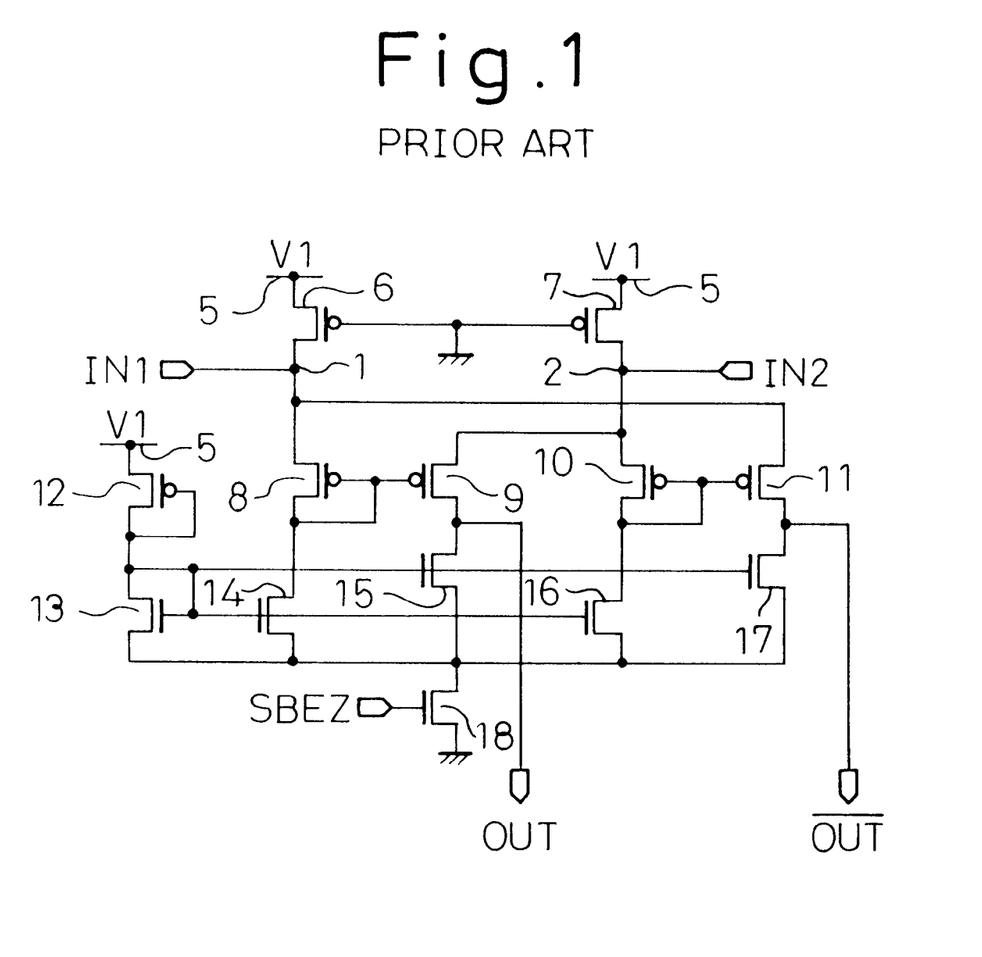
FIG. 1 is a circuit diagram showing a prior art amplifier.

FIG. 1 shows the amplifier circuit described in "IEEE international Solid-State Circuits Conference, p. 208, 1992, by K. Sasaki et al."

The gates of PMOS transistors 6 and 7 are grounded, while their sources are connected to a power supply line 5 and their drains are connected to input terminals IN1 and IN2, respectively. When a current is drawn from the input terminal IN1, with the transistor 6 acting as its load, the potential of node 1 drops slightly and the current drawn from IN1 is thus detected. Likewise, when a current is drawn from the input terminal IN2, with the transistor 7 acting as its load, the potential at node 2 drops slightly and the current drawn from IN2 is thus detected.

A PMOS transistor 12 operates as a constant current source and NMOS transistors 13 to 17 together form a current-mirror circuit, so that a constant current is allowed to flow through the transistors 14 to 17.

A PMOS transistor 8, which is connected between the node 1 and the constant current source 14, passes the potential drop at the node 1 to its drain and then to the gate of a PMOS transistor 9 connected to it. The current flowing between the source and drain of the PMOS transistor 9 changes according to its source-to-gate voltage which changes as its source potential (=potential of the node 2) or its gate potential (=drain potential of the transistor 8) changes. When the current flowing into the transistor 9 exceeds the current allowed by the constant current source 15, the excess current flows out of an output terminal OUT and charges an input node of the next-stage circuit. When the current flowing into the transistor 9 falls below the current allowed by the constant current source 15, the amount of current equal to the deficit is drawn from the output terminal OUT, and the input node of the next-stage circuit is thus discharged.

A PMOS transistor 10, which is connected between the node 2 and the constant current source 16, passes the potential drop at the node 2 to its drain and then to the gate of a PMOS transistor 11 connected to it. The current flowing between the source and drain of the PMOS transistor 11 changes according to its source-to-gate voltage which changes as its source potential (=potential of the node 1) or its gate potential (=drain potential of the transistor 10) changes. When the current flowing into the transistor 11 exceeds the current allowed by the constant current source 17, the excess current flows out of an output terminal $\overline{\text{OUT}}$ and charges an input node of the next-stage circuit. When the current flowing into the transistor 11 falls below the current allowed by the constant current source 17, the amount of current equal to the deficit is drawn from the output terminal $\overline{\text{OUT}}$, and the input node of the next-stage circuit is thus discharged.

SBEZ denotes a control signal for controlling the activation/deactivation of the amplifier, and reference numeral 18 designates an NMOS transistor whose on/off operation is controlled by the control signal SBEZ. The drain of the NMOS transistor 18 is connected to the sources of the transistors 13 to 17, its source is grounded, and its gate is supplied with the control signal SBEZ.

When activating the amplifier, the control signal SBEZ is set to a high level and the NMOS transistor 18 is thus turned on; when deactivating the amplifier, the control signal SBEZ is set to a low level and the NMOS transistor 18 is thus turned off.

The size of each of the transistors constituting the amplifier of FIG. 1 is chosen so that when no current is drawn from the input terminals IN1 and IN2, the nodes 1 and 2 will be maintained at a potential close to the supply voltage V1 and, when a current is drawn from IN1 or IN2, the potential of the node 1 or node 2, respectively, will slightly drop below the supply voltage V1.

Operation of the amplifier of FIG. 1 will be described below. When, in a circuit (not shown) connected to the input stage of the amplifier, a transistor connected between IN1 and the ground potential or a potential lower than V1 is turned on and a current is drawn from IN1, the potential of the node 1 drops and the drain potential of the transistor 8 thus drops, so that the potential of the gate of the transistor 9 connected to it also drops. At this time, since no current is drawn from IN2, the source potential of the transistor 9 is maintained at a value close to the supply voltage Vl. As a result, the source-to-gate voltage of the transistor 9 increases, which increases the current flowing through the transistor 9. The excess current flows out of the output terminal OUT and charges the input node of the next-stage circuit (not shown). For the transistor 11, on the other hand, since the potential of the input node 2 remains unchanged, no change occurs in the potential of its gate connected to the drain of the transistor 10, whereas the potential of its source connected to the node 1 drops slightly. As a result, the source-to-gate voltage of the transistor 11 decreases, and the current flowing through the transistor 11 decreases accordingly. The amount of current equal to the decrease is drawn from the output terminal $\overline{\text{OUT}}$, and the input node of the next-stage circuit is thus discharged.

When, in a circuit (not shown) connected to the input stage of the amplifier, a transistor connected between IN2 and the ground potential or a potential lower than V1 is turned on and a current is drawn from IN2, the potential of the node 2 drops and the drain potential of the transistor 10 thus drops, so that the potential of the gate of the transistor 11 connected to it also drops. At this time, since no current is drawn from IN1, the source potential of the transistor 11 is maintained at a value close to the supply voltage V1. As a result, the source-to-gate voltage of the transistor 11 increases, which increases the current flowing through the transistor 11. The excess current flows out of the output terminal $\overline{\text{OUT}}$ and charges the input node of the next-stage circuit (not shown). For the transistor 9, on the other hand, since the potential of the input node 1 remains unchanged, no change occurs in the potential of its gate connected to the drain of the transistor 8, whereas the potential of its source connected to the node 2 drops slightly. As a result, the source-to-gate voltage of the transistor 9 decreases, and the current flowing through the transistor 9 decreases accordingly. The amount of current equal to the decrease is drawn from the output terminal OUT, and the input node of the next-stage circuit is thus discharged.

As previously noted, it is difficult to operate this amplifier at high speed because the node connected to each of the output terminals OUT and $\overline{\text{OUT}}$ must be driven to its full swing levels.

Figure 2:
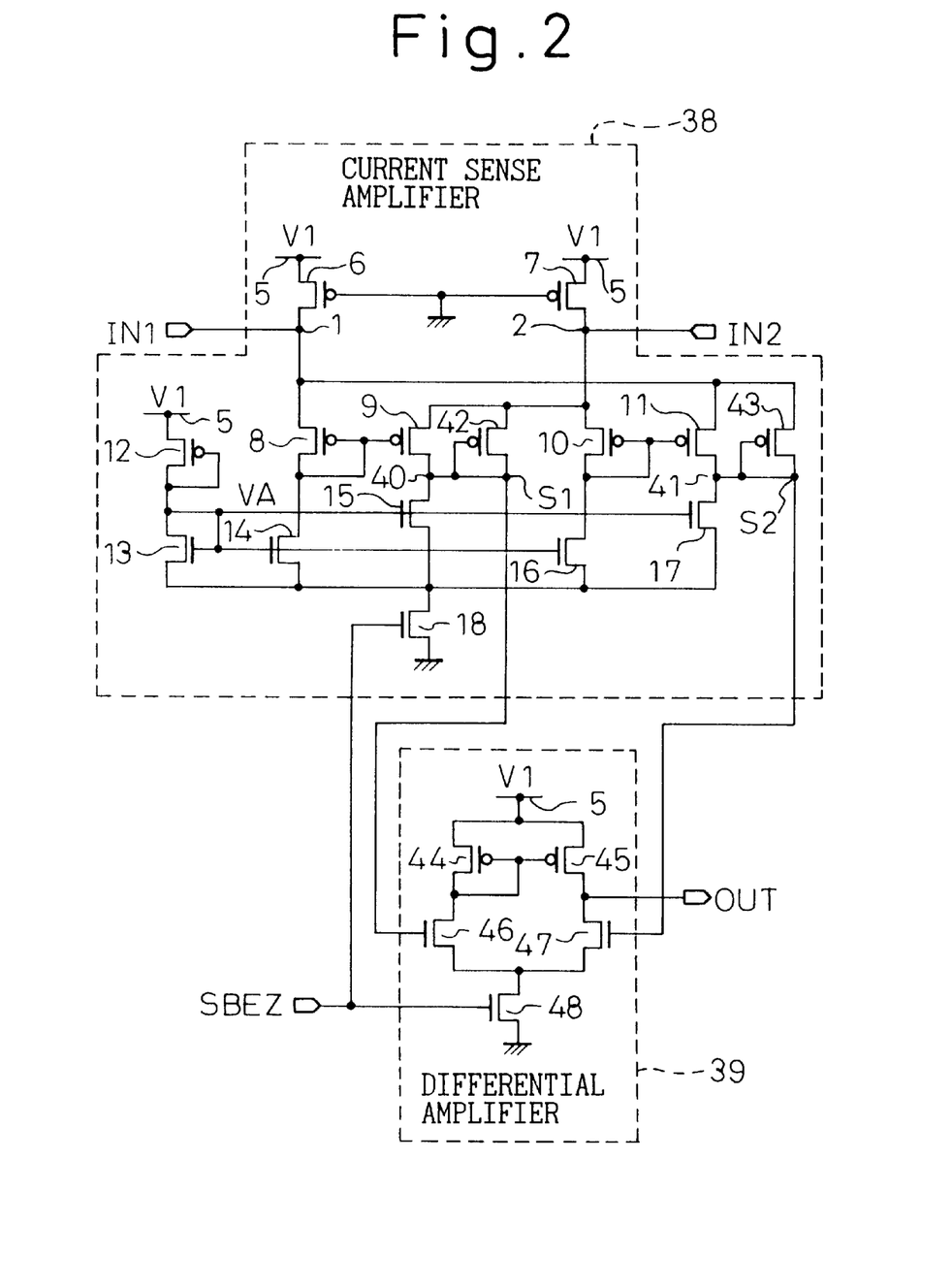
FIG. 2 is a circuit diagram of an amplifier according to one embodiment of the present invention.

FIG. 2 is a circuit diagram of an amplifier according to a first embodiment of the present invention. This circuit differs from the prior art circuit of FIG. 1 in that PMOS transistors 42 and 43 are provided to limit the amplitude of the potentials of the output nodes S1 and S2 of the current sense amplifier 38, and in that a differential amplifier 39 is provided that amplifies the amplitude-limited outputs of the current sense amplifier 38 to a level close to the supply voltage V1. The configuration of the differential amplifier 39 is not limited to the illustrated one, but other known configurations may be employed.

In the circuit of FIG. 2, the gate and drain of the transistor 42 are connected to the output node S1, and its source is connected to the input node 2. The gate and drain of the transistor 43 are connected to the output node S2, and its source is connected to the input node 1.

In the circuit of FIG. 2, the size of each transistor is chosen so that when no current is drawn from either IN1 or IN2, the relation expressed by $i_{15}=i_9+i_{42}$ $i_{17}=i_{11}+i_{43}$ holds among the currents $i_9$, $i_{11}$, $i_{15}$, $i_{17}$, $i_{42}$, and $i_{43}$ flowing through the respective transistors 9, 11, 15, 17, 42, and 43. That is, preferably the transistors 15 and 17 are made larger in capacity for passing current by the amount of current flowing through the respective transistors 42 and 43. Conversely, the transistors 9 and 11 may be made smaller in capacity for passing current by the amount of current flowing through the respective transistors 42 and 43. Also, the size of each transistor is chosen so that the potential at the nodes S1 and S2 at this time is slightly higher than V½.

Operation of the circuit of FIG. 2 will be described below. When a current is drawn from IN1, the current $i_9$ flowing between the source and drain of the transistor 9 increases by a mechanism similar to that shown in the circuit of FIG. 1, and the potential of the node S1 begins to rise and the potential of the node S2 begins to fall. As the potential of the node S1 rises, the source-to-gate voltage of the transistor 42 decreases and the current $i_{42}$ flowing between the source and drain of the transistor 42 decreases accordingly. If this situation continues, the decrease of $i_{42}$ reaches equilibrium with the increase of $i_9$ at a point where $i_9+i_{42}=i_{15}$ and the potential stops rising. That is, the transistor 42 at this time works to prevent the potential of the node S1 from rising beyond a given value. For the transistor 43, on the other hand, since the potential of the node S2 falls, the source-to-gate voltage increases and the current $i_{43}$ increases accordingly. If this situation continues, the increase of $i_{43}$ reaches equilibrium with the decrease of $i_{11}$ at a point where $$i_{11}+i_{43}=i_{17}$$

and the potential stops falling. That is, the transistor 43 at this time works to prevent the potential at the node S2 from falling below a given value.

When a current is drawn from IN2, the current $i_{11}$ flowing between the source and drain of the transistor 11 increases by a mechanism similar to that shown in the circuit of FIG. 1, and the potential of the node S2 begins to rise and the potential of the node S1 begins to fall. As the potential of the node S2 rises, the source-to-gate voltage of the transistor 43 decreases and the current $i_{43}$ flowing between the source and drain of the transistor 43 decreases accordingly. If this situation continues, the decrease of $i_{43}$ reaches equilibrium with the increase of $i_{11}$ at a point where $$i_{11}+i_{43}=i_{17}$$

and the potential stops rising. That is, the transistor 43 at this time works to prevent the potential of the node S2 from rising beyond a given value. For the transistor 42, on the other hand, since the potential of the node S1 falls, the source-to-gate voltage increases and the current $i_{42}$ increases accordingly. If this situation continues, the increase of $i_{42}$ reaches equilibrium with the decrease of $i_9$ at a point where $$i_9+i_{42}=i_{15}$$

and the potential stops falling. That is, the transistor 42 at this time works to prevent the potential of the node S1 from falling below a given value.

Figure 3:
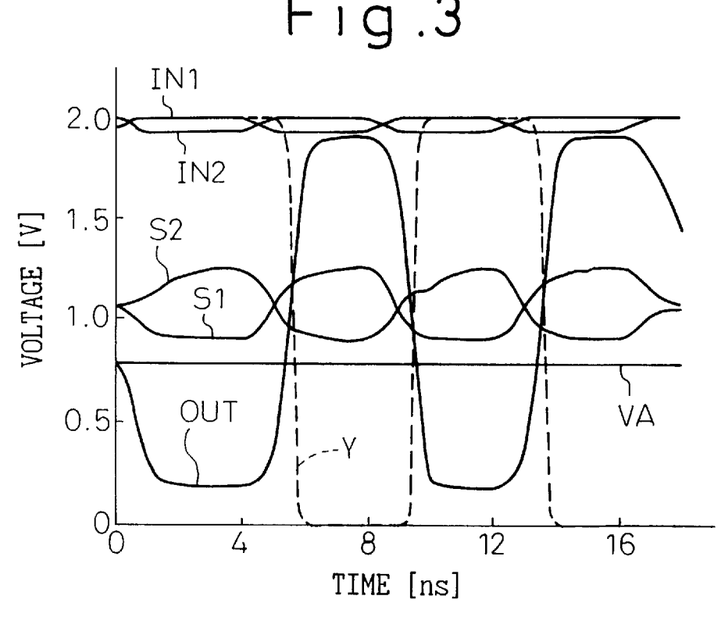
FIG. 3 is a waveform diagram showing the operation of the amplifier of FIG. 2.

FIG. 3 is a waveform diagram for explaining the operation of the circuit shown in FIG. 2. The diagram shows the relationships between the voltages detected at the input terminals IN1 and IN2, the voltages at the output nodes S1 and S2 of the current sense amplifier 38, and the voltage at the output terminal OUT of the differential amplifier 39 when the circuit is operated at high speed with the supply voltage V1=2 V by drawing a current of 100 μA every 4 ns alternately from the input nodes 1 and 2. Here, VA designates the gate voltage of the NMOS transistors 13 to 17, and the dotted line Y shows a signal made by waveshaping the output at the output terminal OUT by an inverter provided on the output side of the differential amplifier 39.

Figure 4:
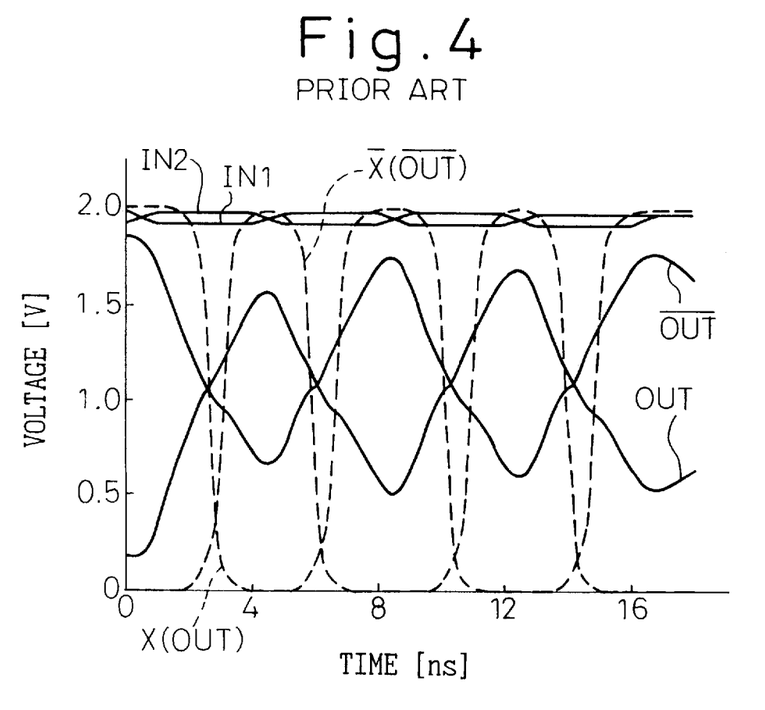
FIG. 4 is a waveform diagram showing the operation of the prior art amplifier of FIG. 1.

For comparison purposes, the relationship among the voltages detected at the input terminals IN1 and IN2 and the voltages at the output terminals OUT and $\overline{\text{OUT}}$ is shown in FIG. 4 when the prior art circuit of FIG. 1 is operated at high speed with the supply voltage V1=2 V by drawing a current of 100 μA every 4 ns alternately from the input nodes 1 and 2. Here, the dotted line X shows a signal made by waveshaping the output signal OUT by an inverter, while the dotted line $\overline{\text{X}}$ shows a signal made by woveshaping the output signal $\overline{\text{OUT}}$ by an inverter.

In high-speed operation, the voltages at OUT and $\overline{\text{OUT}}$ in FIG. 4 are unstable as they begin to fall or rise while they are rising or falling, respectively, according to the previous data, and the rise and fall times of the waveshaped signals X and $\overline{\text{X}}$ are long, with their levels remaining stable only for a short, uncertain period of time. In contrast, the voltages at S1 and S2 in FIG. 3 are stable, though their amplitudes are small, and the signal at the output terminal OUT and the waveshaped signal Y are stable with both signals quickly rising and falling.

Figure 5:
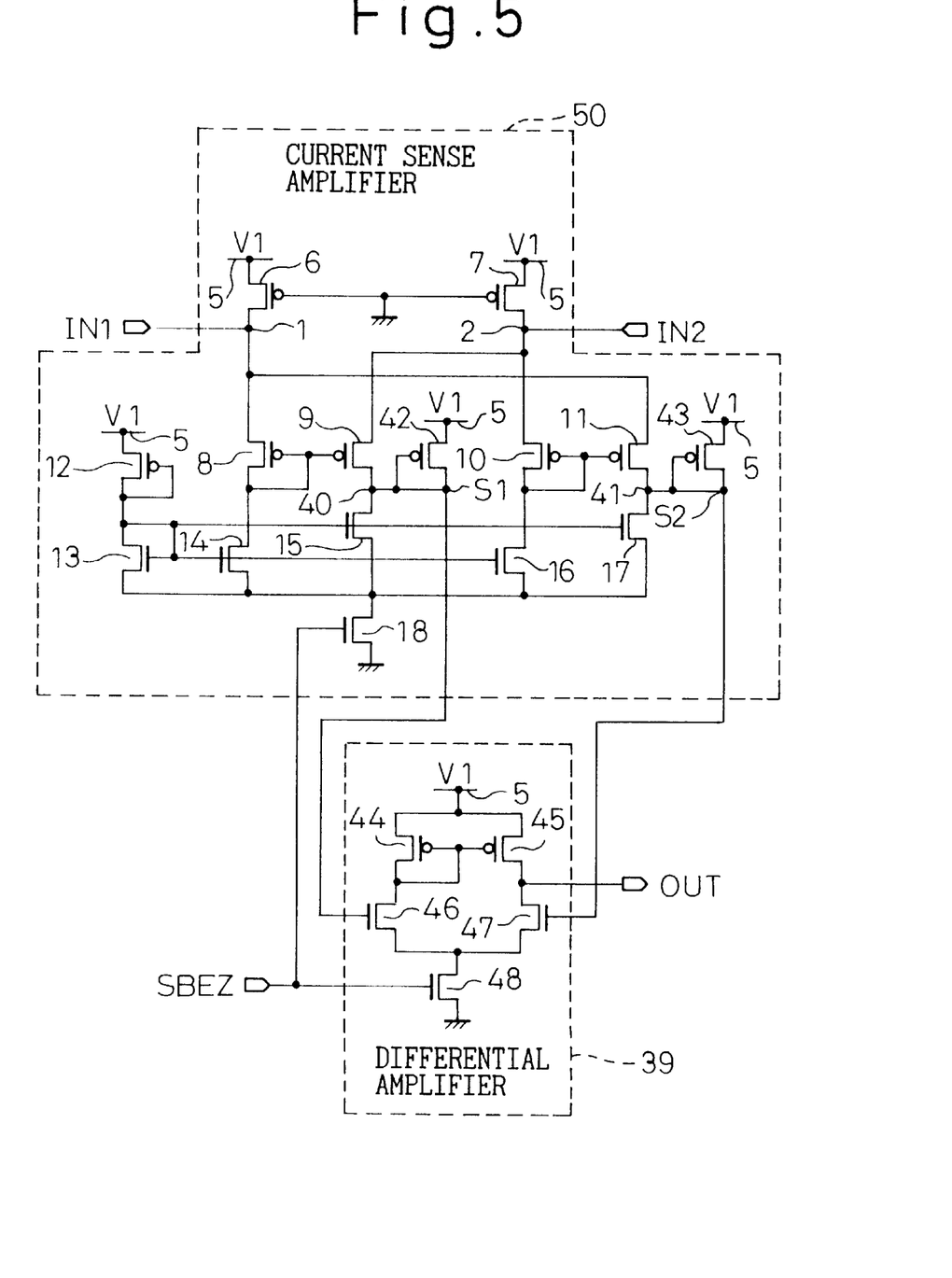
FIG. 5 is a circuit diagram showing one modification of the circuit of FIG. 2.

FIG. 5 shows one modification of the circuit of FIG. 2. While, in the circuit of FIG. 2, the sources of the transistors 42 and 43 are connected to the input terminals IN2 and IN1, respectively, in FIG. 5 they are connected to the supply voltage V1. The circuit operation is essentially the same as described in connection with FIG. 2.

Figure 6:
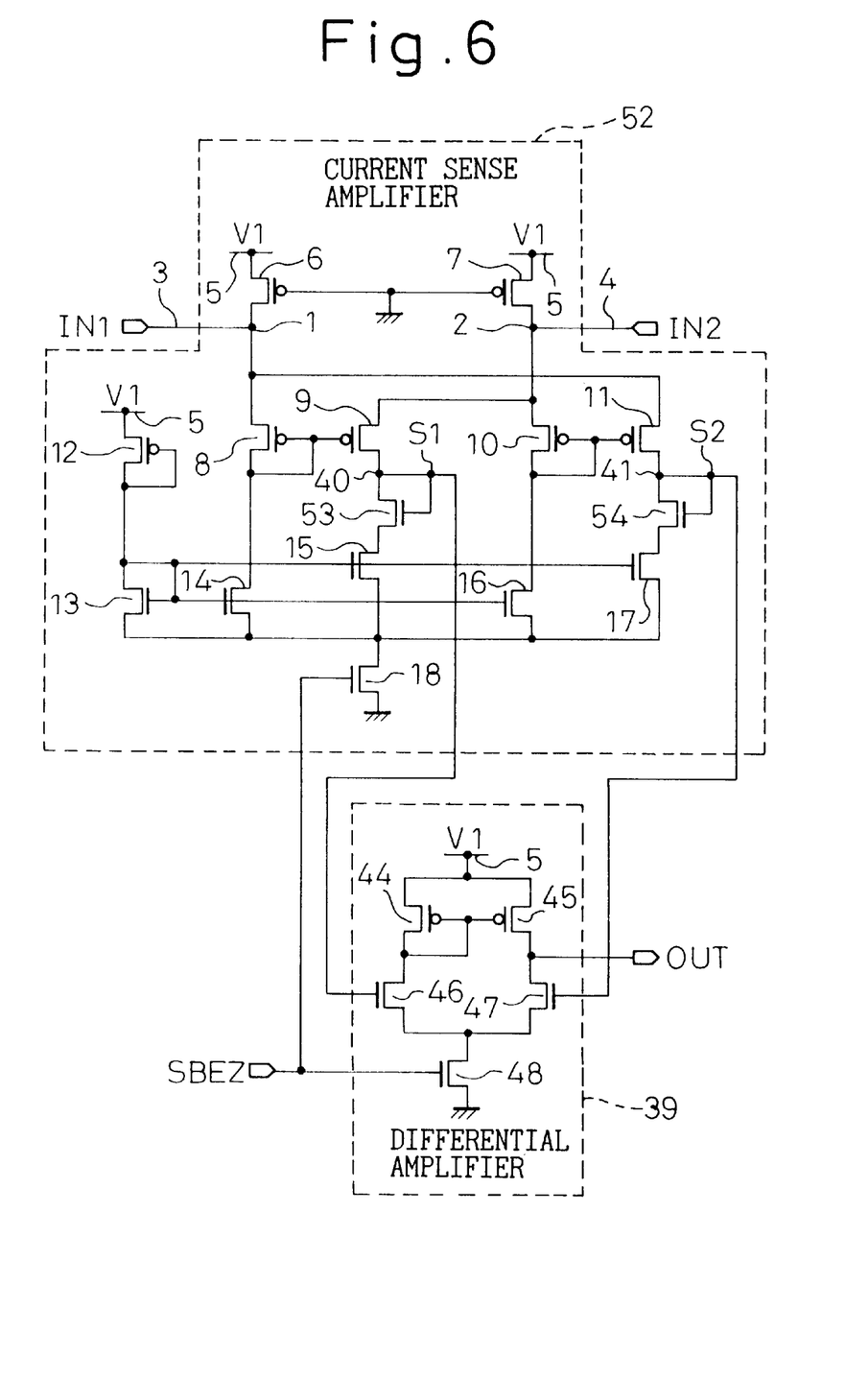
FIG. 6 is a circuit diagram showing a second modification of the circuit of FIG. 2.

FIG. 6 shows a second modification of the circuit of FIG. 2. In the circuit of FIG. 6, NMOS transistors 53 and 54 are added that work to limit the amplitude of the potentials of the output nodes S1 and S2. Since the constant current sources 15 and 17 are designed to pass a current smaller than the current they are capable of, the current flowing through the transistor 53 or 54 can be changed in accordance with the change in the source-to-gate voltage of the transistor 53 or 54, respectively. When the potential of the node S1 or S2 drops with the current flowing in, the source-to-gate voltage of the transistor 53 or 54 falls and $i_{53}$ or $i_{54}$ decreases accordingly, decreasing the flowing-in current and thus preventing the potential from further dropping. When the potential of the node S1 or S2 rises with the current flowing out, the source-to-drain voltage of the transistor 53 or 54 rises and $i_{53}$ or $i_{54}$ increases accordingly, decreasing the flowing-out current and thus preventing the potential from further rising.

The transistors 42 and 43 provided for amplitude limiting in the circuits of FIGS. 2 and 5 let currents flow in the same direction as the current flowing direction of the transistors 9 and 11, as viewed from the nodes S1 and S2. In this configuration, when the current flowing through the transistor 9 or 11 increases and the potential of the node S1 or S2 rises, the current flowing through the transistor 42 or 43 decreases and thus the potential is prevented from rising further; conversely, when the current flowing through the transistor 9 or 11 decreases and the potential of the node S1 or S2 falls, the current flowing through the transistor 42 or 43 increases and thus the potential is prevented from falling further. On the other hand, the transistors 53 and 54 provided in the circuit of FIG. 6 let currents flow in the opposite direction to the current flowing direction of the transistors 9 and 11, as viewed from the nodes S1 and S2. When the current flowing through the transistor 9 or 11 increases and the potential at the node S1 or S2 rises, the current flowing through the transistor 53 or 54 increases and thus the potential is prevented from rising further; conversely, when the current flowing through the transistor 9 or 11 decreases and the potential at the node S1 or S2 falls, the current flowing through the transistor 53 or 54 decreases and thus the potential is prevented from falling further.

Figure 7:
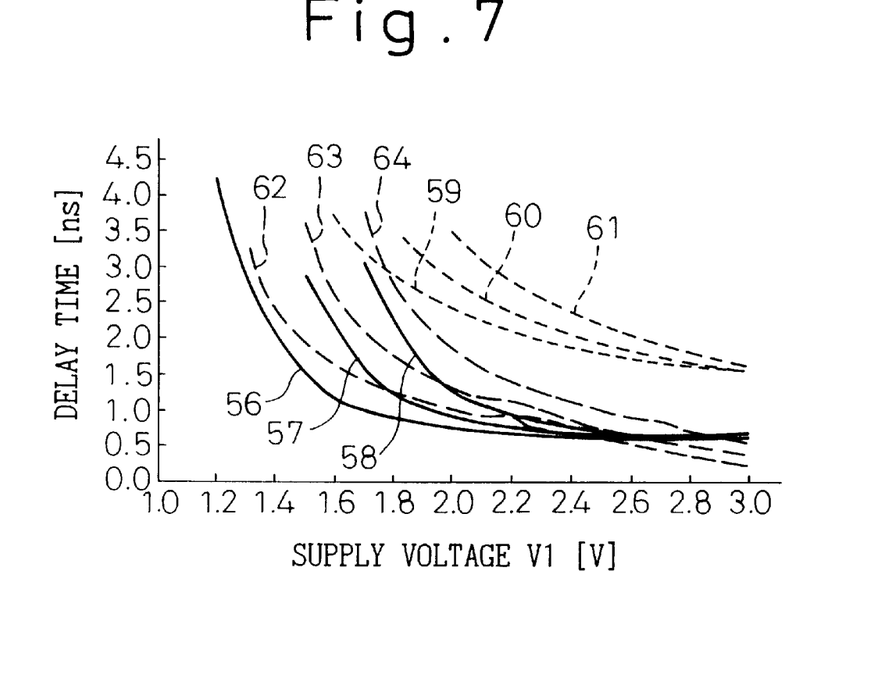
FIGS. 7 and 8 are graphs plotting delay time against supply voltage.
Figure 8:
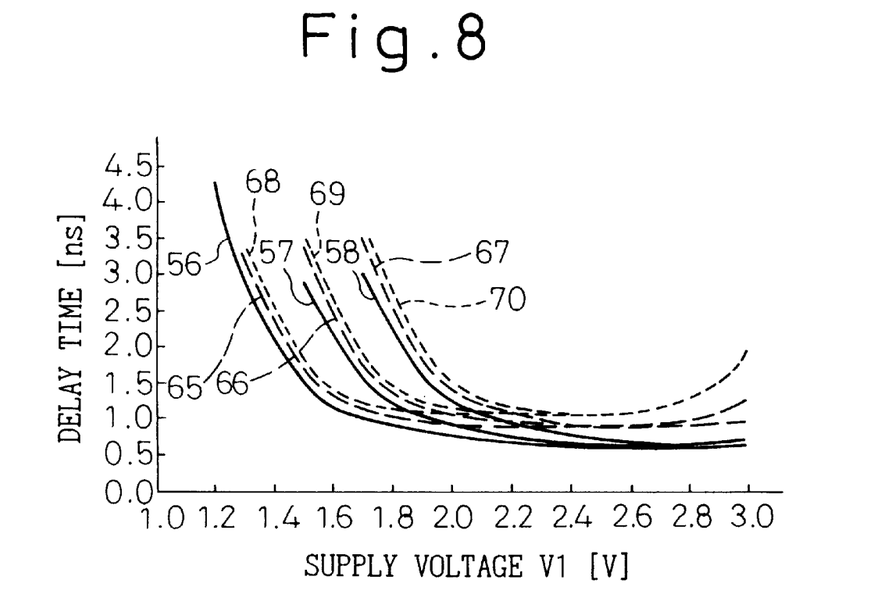

FIG. 7 shows the operating speed of the circuit of FIG. 2 versus the supply voltage V1 for comparison with the first prior art example of FIG. 1 and the earlier described second prior art example, and FIG. 8 shows the operating speed of the circuit of FIG. 2 versus the supply voltage V1 for comparison with the circuits of FIGS. 5 and 6.

In FIGS. 7 and 8, solid lines 56, 57, and 58 each show the operating speed of the circuit of FIG. 2 plotted against the supply voltage V1, the solid line 56 being for the case of Vthp=−0.5 V and Vthn=0.3 V, the solid line 57 being for the case of Vthp=−0.6 V and Vthn=0.4 V, and the solid line 58 being for the case of Vthp=−0.7 V and Vthn=0.5 V, where Vthp is the threshold voltage of the PMOS transistors and Vthn the threshold voltage of the NMOS transistors.

In FIG. 7, dotted lines 59, 60, and 61 each show the operating speed of the first prior art example plotted against the supply voltage V1, the dotted line 59 being for the case of Vthp=−0.5 V and Vthn=0.3 V, the dotted line 60 being for the case of Vthp=−0.6 V and Vthn=0.4 V, and the dotted line 61 being for the case of Vthp=−0.7 V and Vthn=0.5 V.

Dashed lines 62, 63, and 64 each show the operating speed of the second prior art example plotted against the supply voltage V1, the dashed line 62 being for the case of Vthp=−0.5 V and Vthn=0.3 V, the dashed line 63 being for the case of Vthp=−0.6 V and Vthn=0.4 V, and the dashed line 64 being for the case of Vthp=−0.7 V and Vthn=0.5 V.

In FIG. 8, dashed lines 65, 66, and 67 each show the operating speed of the circuit of FIG. 5 plotted against the supply voltage V1, the dashed line 65 being for the case of Vthp=−0.5 V and Vthn=0.3 V, the dashed line 66 being for the case of Vthp=−0.6 V and Vthn=0.4 V, and the dashed line 67 being for the case of Vthp=−0.7 V and Vthn=0.5 V.

Dotted lines 68, 69, and 70 each show the operating speed of the circuit of FIG. 6 plotted against the supply voltage V1, the dotted line 68 for the case of Vthp=−0.5 V and Vthn=0.3 V, the dotted line 69 for the case of Vthp=−0.6 V and Vthn=0.4 V, and the dotted line 70 for the case of Vthp=−0.7 V and Vthn=0.5 V.

As can be seen from FIG. 7, the circuit of FIG. 2 outperforms the first prior art example not only in operating speed but in operable supply voltage range; on the other hand, the second prior art example has higher operating speeds than the circuit of FIG. 2 when the supply voltage V1 is around 3 V, but the operating speed decreases as the supply voltage V1 decreases and, when the supply voltage is 2 V or lower, the circuit of FIG. 2 exhibits higher operating speeds than the second prior art example.

As is apparent from FIG. 7, the circuit of FIG. 2 has a greater margin for the variation of the transistor threshold voltage than the first and second prior art examples.

Figure 9:
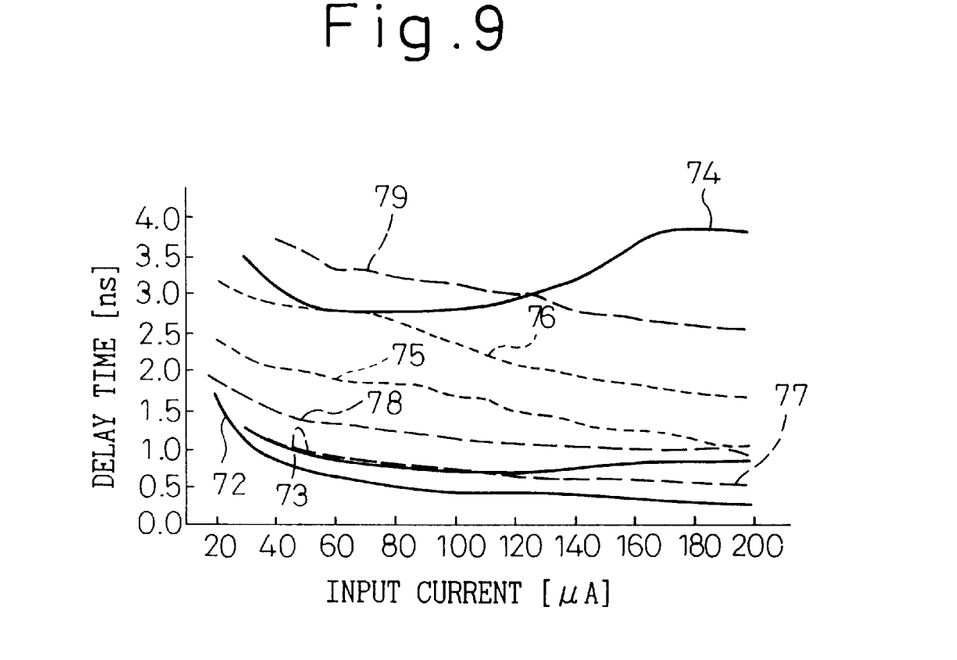
FIGS. 9 and 10 are graphs plotting delay time against input current.
Figure 10:
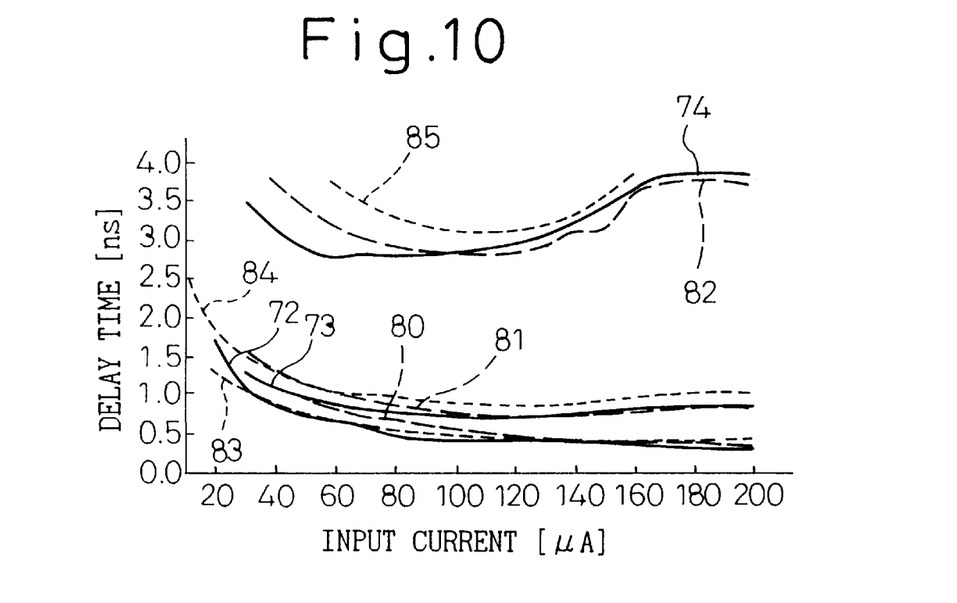

FIG. 9 shows the operating speed of the circuit of FIG. 2 versus input current for comparison with the first and second prior art examples, and FIG. 10 shows the operating speed of the circuit of FIG. 2 versus input current for comparison with the circuits of FIGS. 5 and 6.

In FIGS. 9 and 10, solid lines 72, 73, and 74 each show the operating speed of the circuit of FIG. 2 plotted against the input current, the solid line 72 being for the case of the supply voltage V1=2.5 V, the solid line 73 being for the case of the supply voltage V1=2.0 V, and the solid line 74 being for the case of the supply voltage V1=1.5 V.

In FIG. 9, dotted lines 75 and 76 each show the operating speed of the first prior art example plotted against the input current, the dotted line 75 being for the case of the supply voltage V1=2.5 V and the dotted line 76 being for the case of the supply voltage V1=2.0 V.

Dashed lines 77, 78, and 79 each show the operating speed of the second prior art example plotted against the input current, the dashed line 77 being for the case of the supply voltage V1=2.5 V, the dashed line 78 being for the case of the supply voltage V1=2.0 V, and the dashed line 79 being for the case of the supply voltage V1=1.5 V.

In FIG. 10, dashed lines 80, 81, and 82 each show the operating speed of the circuit of FIG. 5 plotted against the input current, the dashed line 80 being for the case of the supply voltage V1=2.5 V, the dashed line 81 being for the case of the supply voltage V1=2.0 V, and the dashed line 82 being for the case of the supply voltage V1=1.5 V.

Dotted lines 83, 84, and 85 each show the operating speed of the circuit of FIG. 6 plotted against the input current, the dotted line 83 being for the case of the supply voltage V1=2.5 V, the dotted line 84 being for the case of the supply voltage V1=2.0 V, and the dotted line 85 being for the case of the supply voltage V1=1.5 V.

FIG. 9 does not show the operating speed characteristic of the first prior art example for the supply voltage V1=1.5 V, but this is because the first prior art example cannot operate with the supply voltage V1=1.5 V. On the other hand, the circuit of FIG. 2 can operate satisfactorily with the supply voltage V1=1.5 V, as one can see from FIG. 9.

As is apparent from FIG. 9, the second prior art example has performance comparable to that of the circuit of FIG. 2 in terms of the operable input current and operable supply voltage ranges, but the operating speed with low-voltage, small-amplitude signals is faster in the circuit of FIG. 2 than in the second prior art example.

What is claimed is:

1. An amplifier comprising:

a current sense amplifier for converting a difference between currents flowing on a pair of input signal lines into a potential difference, amplifying said potential difference, and outputting first output signals at a pair of first stage output nodes;

a pair of amplitude-limiting transistors, each having a gate and a drain, the gate and the drain being connected with said corresponding one of said pair of first stage output nodes; and a difference amplifier for amplifying said first output signals.

2. The amplifier according to claim 1, wherein said pair of amplitude-limiting transistors are PMOS transistors.

3. The amplifier according to claim 2, wherein sources of said pair of amplitude-limiting transistors are connected with said pair of input signal lines.

4. The amplifier according to claim 2, wherein sources of said pair of amplitude-limiting transistors are connected with a power supply line.

5. The amplifier according to claim 1, wherein said pair of amplitude-limiting transistors are NMOS transistors, and sources of said amplitude-limiting transistors are coupled to a second power supply line.

* * * * *